US011909369B2

(12) United States Patent
Chang (10) Patent No.: US 11,909,369 B2
(45) Date of Patent: Feb. 20, 2024

(54) LOW-PASS FILTER CIRCUIT

(71) Applicant: GUTSCHSEMI LIMITED, Hong Kong (HK)

(72) Inventor: Kuo-Wei Chang, Taipei (TW)

(73) Assignee: GUTSCHSEMI LIMITED, Hong Kong (HK)

( * ) Notice: Subject to any disclaimer, the term of this patent is extended or adjusted under 35 U.S.C. 154(b) by 45 days.

(21) Appl. No.: 17/691,094

(22) Filed: Mar. 9, 2022

(65) Prior Publication Data

US 2023/0155572 A1 May 18, 2023

Related U.S. Application Data

(60) Provisional application No. 63/280,555, filed on Nov. 17, 2021.

(30) Foreign Application Priority Data

Jan. 18, 2022 (TW) .................................. 111102045

(51) Int. Cl.
*H03H 11/04* (2006.01)
(52) U.S. Cl.
CPC .................................... *H03H 11/04* (2013.01)
(58) Field of Classification Search
CPC ...... H03H 11/04; H03H 21/00; H03H 19/004; H03H 7/06
See application file for complete search history.

(56) References Cited

U.S. PATENT DOCUMENTS

| 9,829,904 B2* | 11/2017 | Sakaguchi | ........... H03H 11/126 |
| 2008/0074175 A1* | 3/2008 | Huang | ............... H03K 19/0016 |
| | | | 327/544 |
| 2013/0234688 A1* | 9/2013 | Sakaguchi | ......... H03H 11/1213 |
| | | | 327/558 |

FOREIGN PATENT DOCUMENTS

| CN | 103207636 | | 7/2013 |
| JP | 2002135214 A | * | 5/2002 |
| TW | I590583 | | 7/2017 |

OTHER PUBLICATIONS

"Office Action of Taiwan Counterpart Application", dated Aug. 10, 2022, p. 1-p. 7.

* cited by examiner

*Primary Examiner* — Daniel C Puentes
(74) *Attorney, Agent, or Firm* — JCIPRNET (57) ABSTRACT

A low-pass filter circuit is provided. The low-pass filter circuit includes a low-pass filter and a discharging circuit. The low-pass filter receives an input voltage signal through an input terminal of the low-pass filter circuit during a first period, performs a low-pass filter operation on the input voltage signal to generate a filtered voltage signal, and provides the filtered voltage signal to an output terminal of the low-pass filter circuit. The discharging circuit suppresses a leakage current flowing between the output terminal and a reference low voltage in response to the input voltage signal during the first period.

8 Claims, 7 Drawing Sheets

LOW-PASS FILTER CIRCUIT

CROSS-REFERENCE TO RELATED APPLICATION

This application claims the priority benefit of U.S. Provisional Application No. 63/280,555, filed on Nov. 17, 2021, and Taiwan Application No. 111102045, filed on Jan. 18, 2022. The entirety of each of the above-mentioned patent applications is hereby incorporated by reference herein and made a part of this specification.

BACKGROUND

Technical Field

The disclosure relates to a low-pass filter circuit, and in particular, relates to a low-pass filter circuit capable of operating stably under an excessively-low operating current condition.

Description of Related Art

Low-pass filters with large time constants (RC constants) are widely used in electronic devices, so that the electronic devices may obtain clean signals. Therefore, the electronic devices may provide stable performance. Generally, in order to achieve a large time constant, a low-pass filter may utilize active components to provide an excessively large resistance value. As such, the layout area of the low-pass filter may be reduced.

The abovementioned low-pass filter has an excessively large time constant. During the period when the filtering operation is not performed, the low-pass filter needs a long discharging time to discharge the voltage value remaining inside the low-pass filter. Therefore, the low-pass filter needs to use a discharging circuit to rapidly discharge the voltage value remaining in the low-pass filter. It should be noted that the low pass filter may have an excessively low operating current value based on the operation of the active components. The operating current value may become unstable due to the leakage current of the discharging circuit, and the performance of the low-pass filter may thus be affected.

SUMMARY

The disclosure provides a low-pass filter circuit capable of operating stably under an excessively-low operating current condition.

The disclosure provides a low-pass filter circuit including a low-pass filter and a discharging circuit. The low-pass filter is coupled between an input terminal of the low-pass filter circuit and an output terminal of the low-pass filter circuit. The low-pass filter receives an input voltage signal through the input terminal during a first period, performs a low-pass filter operation on the input voltage signal to generate a filtered voltage signal, and provides the filtered voltage signal to the output terminal. The discharging circuit is coupled between the output terminal and a reference low voltage. The discharging circuit receives the input voltage signal and suppresses a leakage current flowing between the output terminal and the reference low voltage in response to the input voltage signal during the first period.

To sum up, during the first period, the discharging circuit suppresses the leakage current flowing between the output terminal and the reference low voltage in response to the input voltage signal. Therefore, under the excessively-low operating current condition, the low-pass filter circuit may not be affected by the leakage current and may still provide a stable filtered voltage signal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Several embodiments of the disclosure are described in detail below accompanying with figures. In terms of the reference numerals used in the following descriptions, the same reference numerals in different figures should be considered as the same or the like elements. The embodiments are only a portion of the disclosure, which do not present all embodiments of the disclosure. More specifically, these embodiments are only examples in the scope of the patent application of the disclosure.

Figure 1:
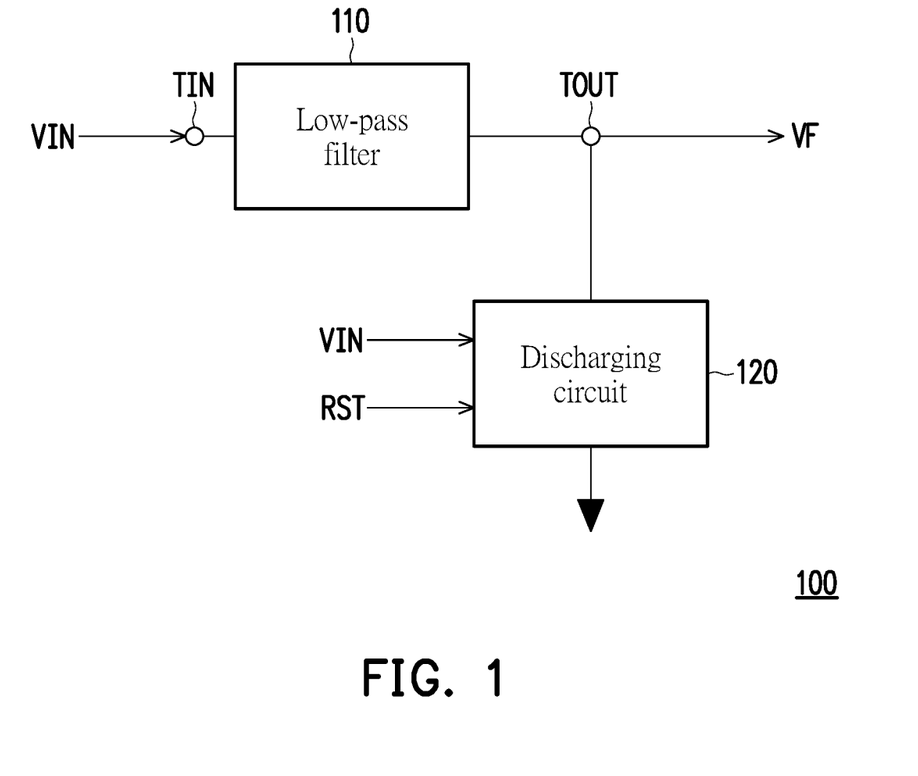
FIG. 1 is a schematic diagram illustrating a low-pass filter circuit according to a first embodiment of the disclosure.

With reference to FIG. 1, FIG. 1 is a schematic diagram illustrating a low-pass filter circuit according to a first embodiment of the disclosure. In this embodiment, a low-pass filter circuit 100 includes a low-pass filter 110 and a discharging circuit 120. The low-pass filter 110 is coupled between an input terminal TIN of the low-pass filter circuit 100 and an output terminal TOUT of the low-pass filter circuit 100. The low-pass filter 110 receives an input voltage signal VIN through the input terminal TIN of the low-pass filter circuit 100 during a first period. The low-pass filter 110 performs a low-pass filter operation on the input voltage signal VIN to generate a filtered voltage signal VF. That is, the input voltage signal VIN is provided during the first period, and the low-pass filter 110 performs the low-pass filter operation on the input voltage signal VIN during the first period. The low-pass filter 110 further provides the filtered voltage signal VF to the output terminal TOUT of the low-pass filter circuit 100. Therefore, the low-pass filter circuit 100 may output the filtered voltage signal VF through the output terminal TOUT.

In this embodiment, supply of the input voltage signal VIN is stopped during a second period. Therefore, the low-pass filter 110 may stop performing the low-pass filter operation during the second period.

In this embodiment, the discharging circuit 120 is coupled between the output terminal TOUT and a reference low voltage (e.g., grounded). The discharging circuit 120 receives the input voltage signal VIN and suppresses a leakage current flowing between the output terminal TOUT and the reference low voltage in response to the input voltage signal VIN during the first period.

During the first period, the discharging circuit 120 suppresses the leakage current flowing between the output terminal TOUT and the reference low voltage in response to the input voltage signal VIN. In this way, under an excessively-low operating current condition, the low-pass filter circuit 100 may not be affected by the leakage current and may still provide a stable filtered voltage signal VF.

Further, during the first period, a voltage value of an internal node of the discharging circuit 120 is maintained based on the input voltage signal VIN. The filtered voltage signal VF located at the output terminal TOUT is substantially equal to the voltage value of the internal node of the discharging circuit 120. Therefore, during the first period, the discharging circuit 120 has no leakage current. Besides, during the second period when the low-pass filter 110 does not receive the input voltage signal VIN, the discharging circuit 120 pulls down a voltage value of the filtered voltage signal VF in response to a reset signal RST.

In some embodiments, the input voltage signal VIN and the reset signal RST may be provided by at least one external circuit (not shown).

Figure 2:
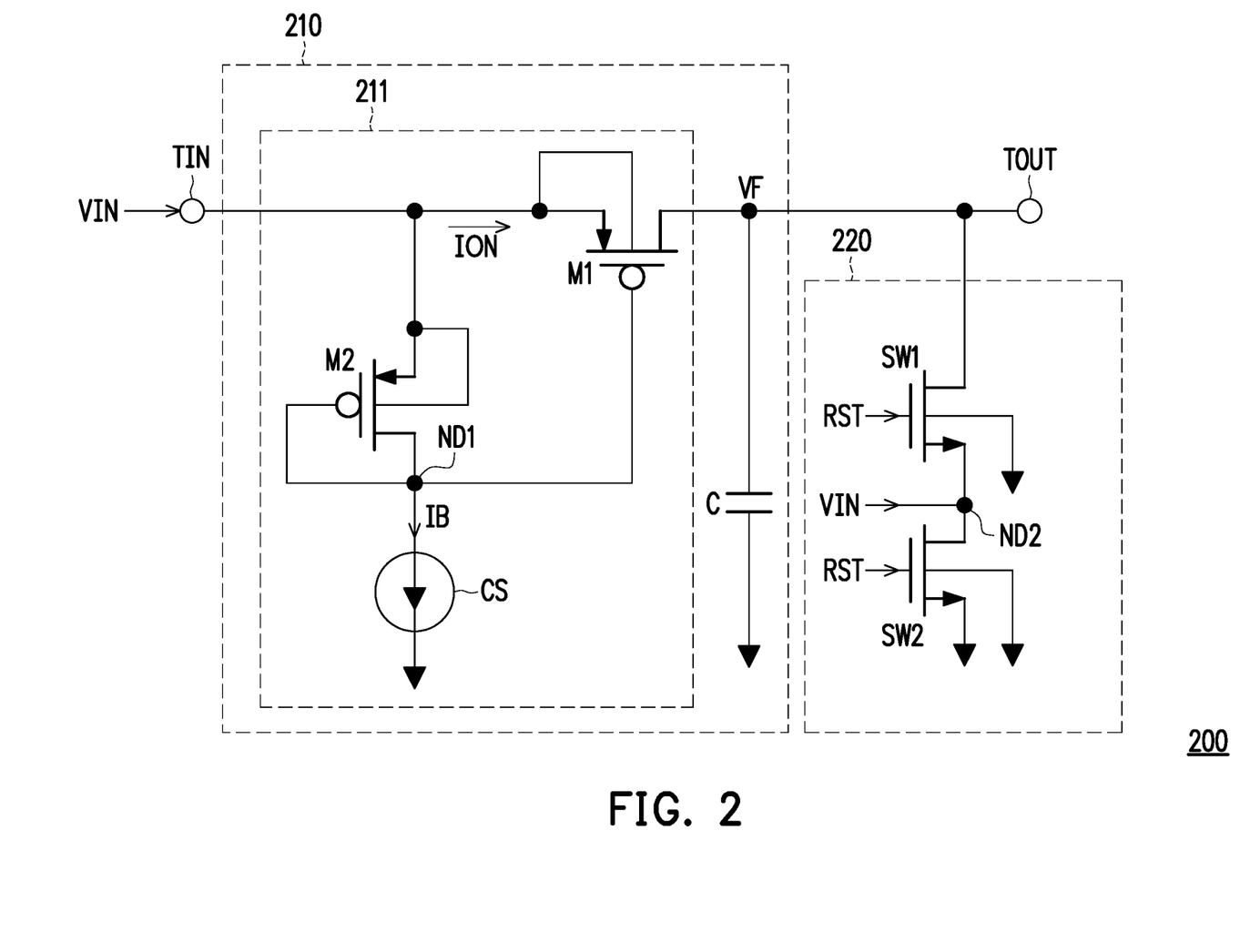
FIG. 2 is a schematic circuit diagram illustrating a low-pass filter circuit according to a second embodiment of the disclosure.

With reference to FIG. 2, FIG. 2 is a schematic circuit diagram illustrating a low-pass filter circuit according to a second embodiment of the disclosure. In this embodiment, a low-pass filter circuit 200 includes a low-pass filter 210 and a discharging circuit 220. The low-pass filter 210 includes an equivalent resistance generating circuit 211 and a capacitor C. The equivalent resistance generating circuit 211 is coupled between the input terminal TIN and the output terminal TOUT. The equivalent resistance generating circuit 211 is configured to generate an equivalent resistance value. The capacitor C is coupled between the output terminal TOUT and the reference low voltage. The capacitor C is configured to provide a capacitance value.

In this embodiment, the equivalent resistance generating circuit 211 includes a current source CS and transistors M1 and M2. The current source CS is coupled to a reference node ND1. The current source CS provides a reference current IB to the reference node ND1.

A first terminal of the transistor M1 is coupled to the input terminal TIN. A second terminal of the transistor M1 is coupled to the output terminal TOUT. A control terminal of the transistor M1 is coupled to the reference node ND1. A first terminal of the transistor M2 is coupled to the input terminal TIN. A second terminal of the transistor M2 and a control terminal of the transistor M2 are coupled to the reference node ND1.

In this embodiment, each of the transistors M1 and M2 is a P-type field-effect transistor (FET). Taking this embodiment as an example, each of the transistors M1 and M2 is a P-type metal-oxide-semiconductor field-effect transistor (MOSFET). The first terminal of the transistor M1 is a source of the transistor M1. The second terminal of the transistor M1 is a drain of the transistor M1. The control terminal of the transistor M1 is a gate of the transistor M1. The first terminal of the transistor M2 is a source of the transistor M2. The second terminal of the transistor M2 is a drain of the transistor M2. The control terminal of the transistor M2 is a gate of the transistor M2. In this embodiment, the transistors M1 and M2 may form a current mirror.

In this embodiment, the current source CS provides the reference current IB to the reference node ND1. A current value of the reference current IB is excessively low, about subnano amperes to nano amperes. The transistors M1 and M2 operate in a weak-inversion mode. Therefore, the transistors M1 and M2 have substantially large on-resistance values. In addition, in terms of layout design, an aspect ratio of a channel of the transistor M1 is less than an aspect ratio of a channel of the transistor M2. For instance, the aspect ratio of the channel of the transistor M2 is designed to be 100 times the aspect ratio of the channel of the transistor M1, but the disclosure is not limited to this. An operating current ION is a current flowing through the transistor M1. A current value of the operating current ION is significantly lower than a current value of the reference current IB. The equivalent resistance value is determined by an on-resistance value of the transistor M1. Therefore, the equivalent resistance generating circuit 211 may provide an excessively large equivalent resistance value based on the on-resistance value of the transistor M1. As such, a layout area of the capacitor C is allowed to be reduced.

In this embodiment, the discharging circuit 220 includes discharging switches SW1 and SW2. A first terminal of the discharging switch SW1 is coupled to the output terminal TOUT. A second terminal of the discharging switch SW1 is coupled to a connection node ND2. A control terminal of the discharging switch SW1 is configured to receive the reset signal RST. A first terminal of the discharging switch SW2 is coupled to the second terminal of the discharging switch SW1. A second terminal of the discharging switch SW2 is coupled to the reference low voltage. A control terminal of the discharging switch SW2 is configured to receive the reset signal RST.

In this embodiment, both the discharging switches SW1 and SW2 may be implemented by bipolar transistors (BJTs), any type of FETs, or transmission gates. Taking this embodiment as an example, each of the discharging switches SW1 and SW2 is an N-type MOSFET. The reset signal RST is a signal with a high voltage level.

During the first period, supply of the reset signal RST is stopped. The control terminals of the discharging switches SW1 and SW2 are both at a low voltage level. Therefore, both the discharging switches SW1 and SW2 are turned off. In addition, during the first period, the input voltage signal VIN is provided to the connection node ND2. A voltage value of the connection node ND2 is pulled up in response to the input voltage signal VIN. The voltage value of the connection node ND2 is substantially equal to or close to a voltage value at the output terminal TOUT. A voltage difference between the first terminal and the second terminal of the discharging switch SW1 is substantially equal to 0 volts. In this way, during the first period, the turned-off discharging switch SW1 does not have a leakage current value.

The aspect ratio of the channel of the transistor M2 is, for example, 100 times the aspect ratio of the channel of the transistor M1. A current value flowing through the transistor M2 is substantially equal to the current value of the reference current IB. Therefore, a current value of the operating current ION flowing through the transistor M1 is approximately equal to one percent of the current value of the reference current IB. The operating current ION is approximately 10 picoamperes or tens of picoamperes. The operating current ION having the abovementioned low current value may have high leakage sensitivity. Typically, a switch or transistor that is turned off may have a leakage current of several picoamperes. Therefore, the abovementioned low current value of the operating current ION is disturbed by the leakage current of several picoamperes and becomes unstable. It should be noted that in this embodiment, the discharging circuit 220 may respond to the input voltage signal VIN to prevent the discharging switch SW1 from having a leakage current value. Therefore, the operating current ION may be stable.

It should also be noted that the discharging circuit 220 uses the input voltage signal VIN to suppress the leakage current value. The discharging circuit 220 may receive the input voltage signal VIN through the input terminal TIN. That is, the connection node ND2 may be designed to be connected to the input terminal TIN. A signal input terminal is not required to be added to the low-pass filter circuit 200 to receive an additional signal. Therefore, a volume of the low-pass filter circuit 200 is not increased.

During the second period, the reset signal RST is supplied. Supply of the input voltage signal VIN is stopped. The control terminals of the discharging switches SW1 and SW2 are both at a high voltage level. Therefore, both the discharging switches SW1 and SW2 are turned on. During the second period, the discharging circuit 220 pulls down the voltage value of the filtered voltage signal VF to a voltage value of the reference low voltage (e.g., 0 volts).

Figure 3:
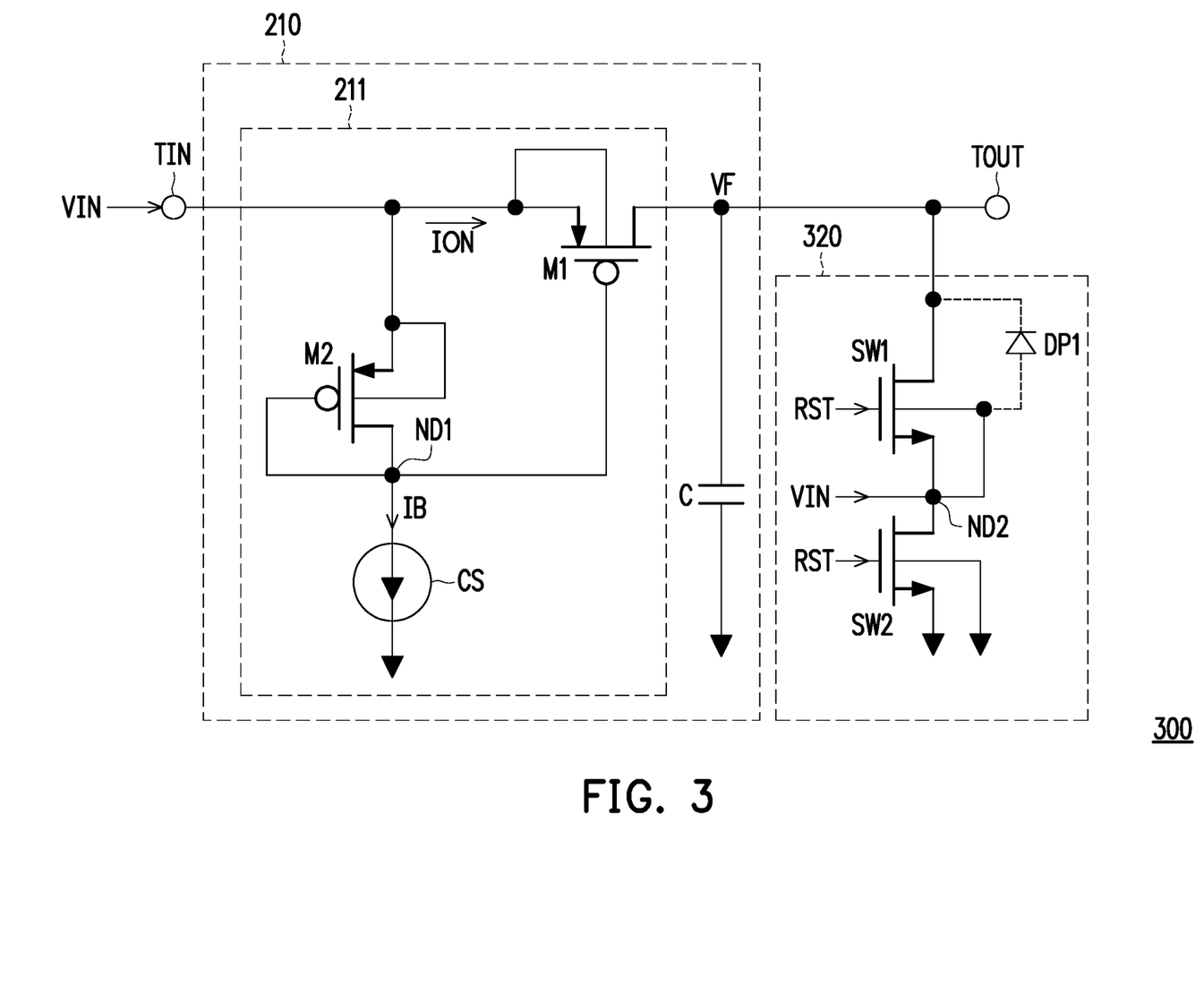
FIG. 3 is a schematic circuit diagram illustrating a low-pass filter circuit according to a third embodiment of the disclosure.

With reference to FIG. 3, FIG. 3 is a schematic circuit diagram illustrating a low-pass filter circuit according to a third embodiment of the disclosure. In this embodiment, a low-pass filter circuit 300 includes the low-pass filter 210 and a discharging circuit 320. The implementation of the low-pass filter 210 is described in detail in the second embodiment, so description thereof is not repeated herein.

The discharging circuit 320 includes the discharging switches SW1 and SW2. The first terminal of the discharging switch SW1 is coupled to the output terminal TOUT. The second terminal of the discharging switch SW1 is coupled to the connection node ND2. The control terminal of the discharging switch SW1 is configured to receive the reset signal RST. The first terminal of the discharging switch SW2 is coupled to the second terminal of the discharging switch SW1. The second terminal of the discharging switch SW2 is coupled to the reference low voltage. The control terminal of the discharging switch SW2 is configured to receive the reset signal RST. Taking this embodiment as an example, each of the discharging switches SW1 and SW2 is an N-type MOSFET. The reset signal RST is a signal with a high voltage level. It should be noted that in this embodiment, the second terminal of the discharging switch SW1 is electrically connected to a body terminal of the discharging switch SW1.

In this embodiment, a parasitic diode DP1 is provided between the base and the first terminal (i.e., the drain) of the discharging switch SW1. An anode of the parasitic diode DP1 corresponds to the body terminal the discharging switch SW1. A cathode of the parasitic diode DP1 corresponds to the first terminal of the discharging switch SW1. The second terminal of the discharging switch SW1 is electrically connected to the body terminal the discharging switch SW1. In this way, a voltage difference between the anode and the cathode of the parasitic diode DP1 is substantially equal to 0 volts. Therefore, the parasitic diode DP1 does not have a reverse leakage current value.

Figure 4:
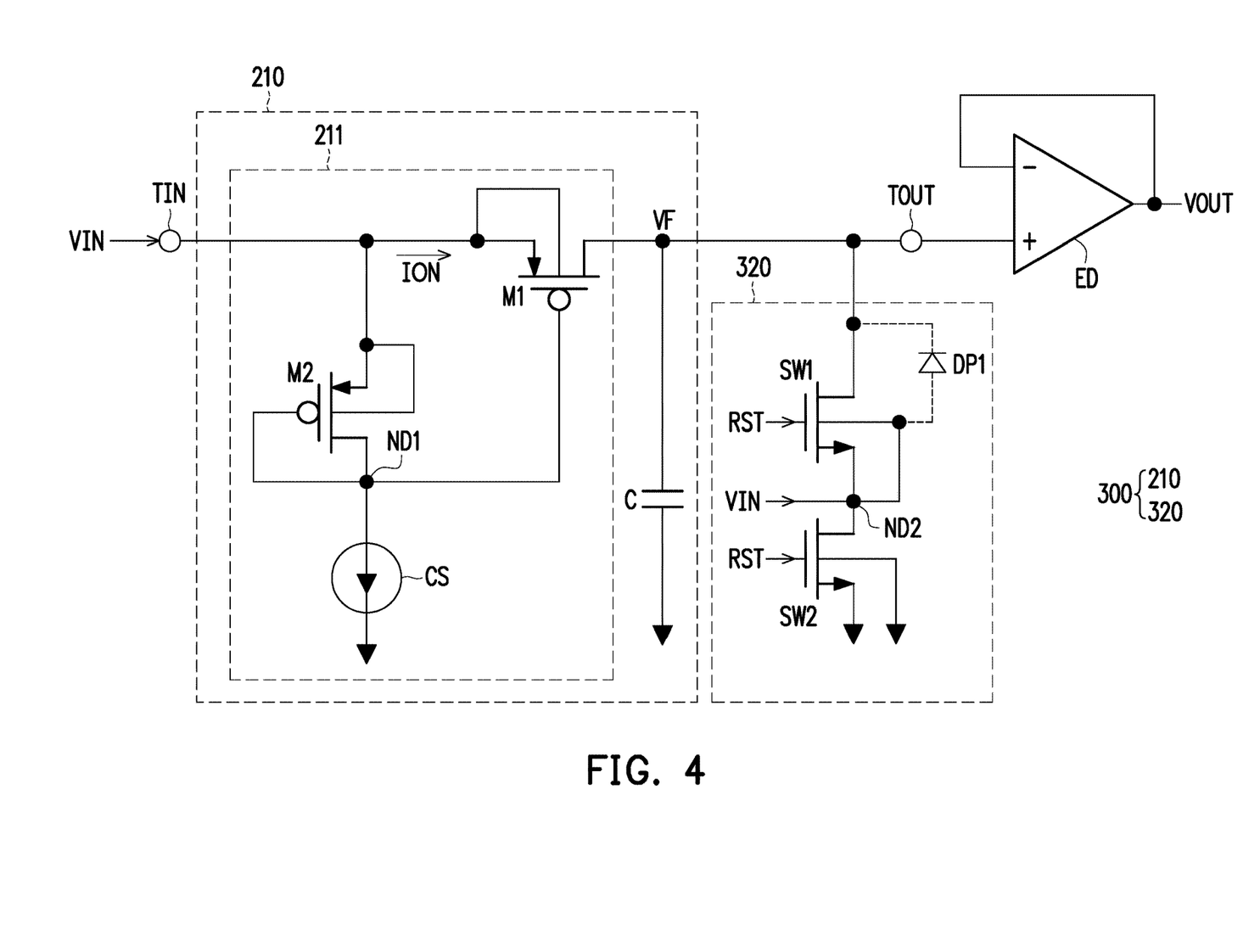
FIG. 4 is a schematic diagram illustrating an application according to the third embodiment of the disclosure.

With reference to FIG. 4, FIG. 4 is a schematic diagram illustrating an application according to the third embodiment of the disclosure. In this embodiment, the low-pass filter circuit 300 is applied to an external device ED. In this embodiment, the external device ED is coupled to the output terminal TOUT of the low-pass filter circuit 300. The low-pass filter circuit 300 may provide the filtered voltage signal VF to act as a reference voltage signal for the external device ED. The external device ED provides an output voltage signal VOUT according to the reference voltage signal. In this embodiment, the external device ED may be a buffer, but the disclosure is not limited thereto. In some embodiments, the external device ED may be a low dropout (LDO) circuit, a comparator, or an error amplifier or the like.

Figure 5:
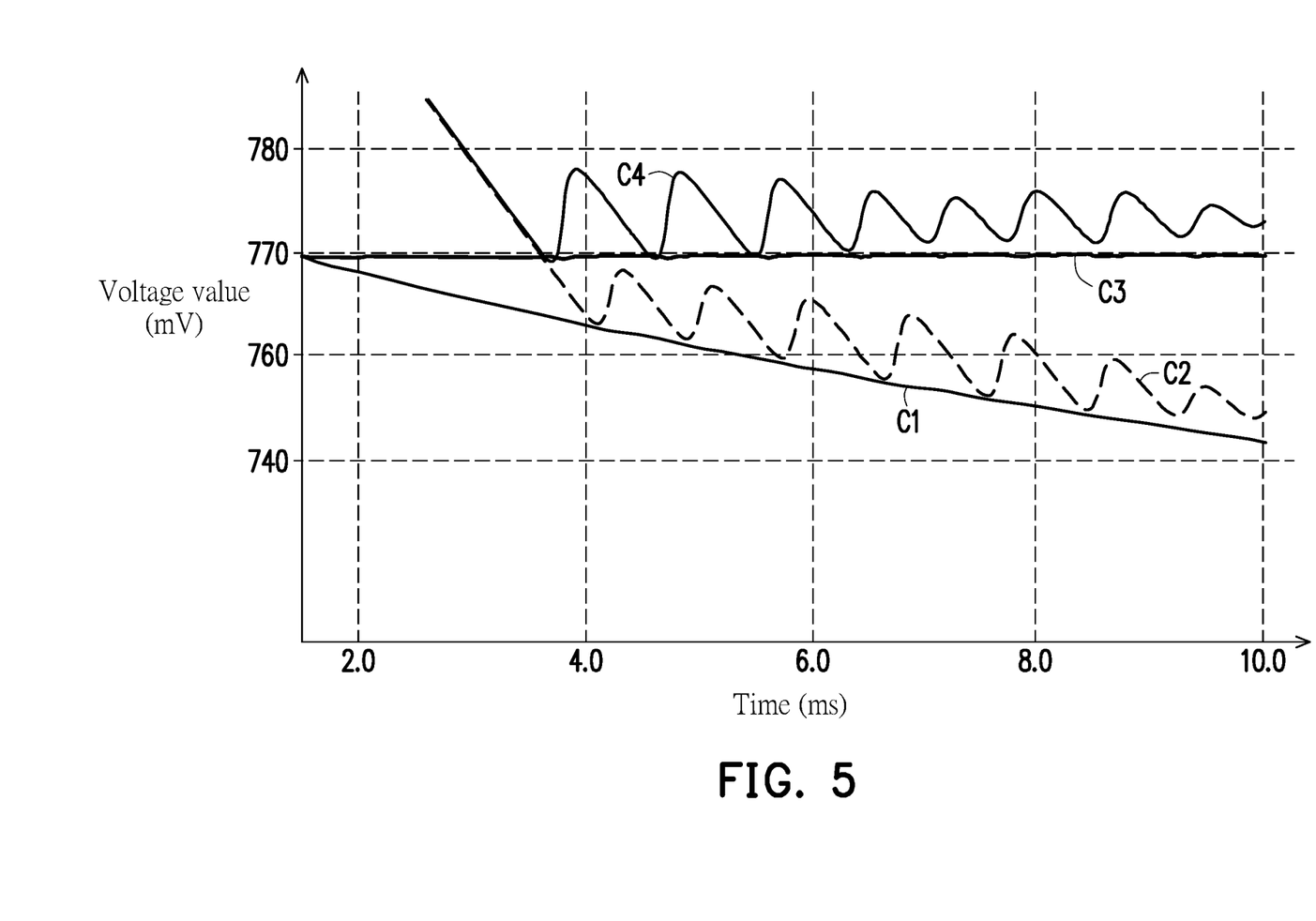
FIG. 5 is a waveform graph comparing performance between the low-pass filter circuit depicted in FIG. 4 and a conventional low-pass filter circuit.

With reference to FIG. 4 and FIG. 5 together, FIG. 5 is a waveform graph comparing performance between the low-pass filter circuit depicted in FIG. 4 and a conventional low-pass filter circuit. The vertical axis of the comparison waveform graph is represented by the voltage value. The unit of voltage value is millivolt (mV). The horizontal axis of the comparison waveform graph is represented by time. The unit of time is milliseconds (ms). FIG. 5 shows waveforms C1 to C4 generated in a high temperature environment such as 155° C. The waveform C1 is the waveform of the reference voltage signal provided by the conventional low-pass filter circuit. The waveform C2 is a waveform of the output voltage signal generated by the external device having the reference voltage signal of the waveform C1. In a high temperature environment, the discharging circuit of the conventional low-pass filter circuit still generates a leakage current even when the discharging circuit is turned off, so that the voltage value of the reference voltage signal is gradually pulled down. Therefore, the voltage value of the output voltage signal also gradually decreases during the period when the output voltage signal is adjusted, for example, by the LDO.

The waveform C3 is the waveform of the reference voltage signal provided by the low-pass filter circuit 300. The waveform C4 is a waveform of the output voltage signal VOUT generated by the external device ED having the reference voltage signal of the waveform C2. In a high temperature environment, the discharging circuit 320 of the low-pass filter circuit 300 does not generate a leakage current. The voltage value of the reference voltage signal may be stabilized. Therefore, the voltage value of the output voltage signal VOUT does not gradually decrease.

Figure 6:
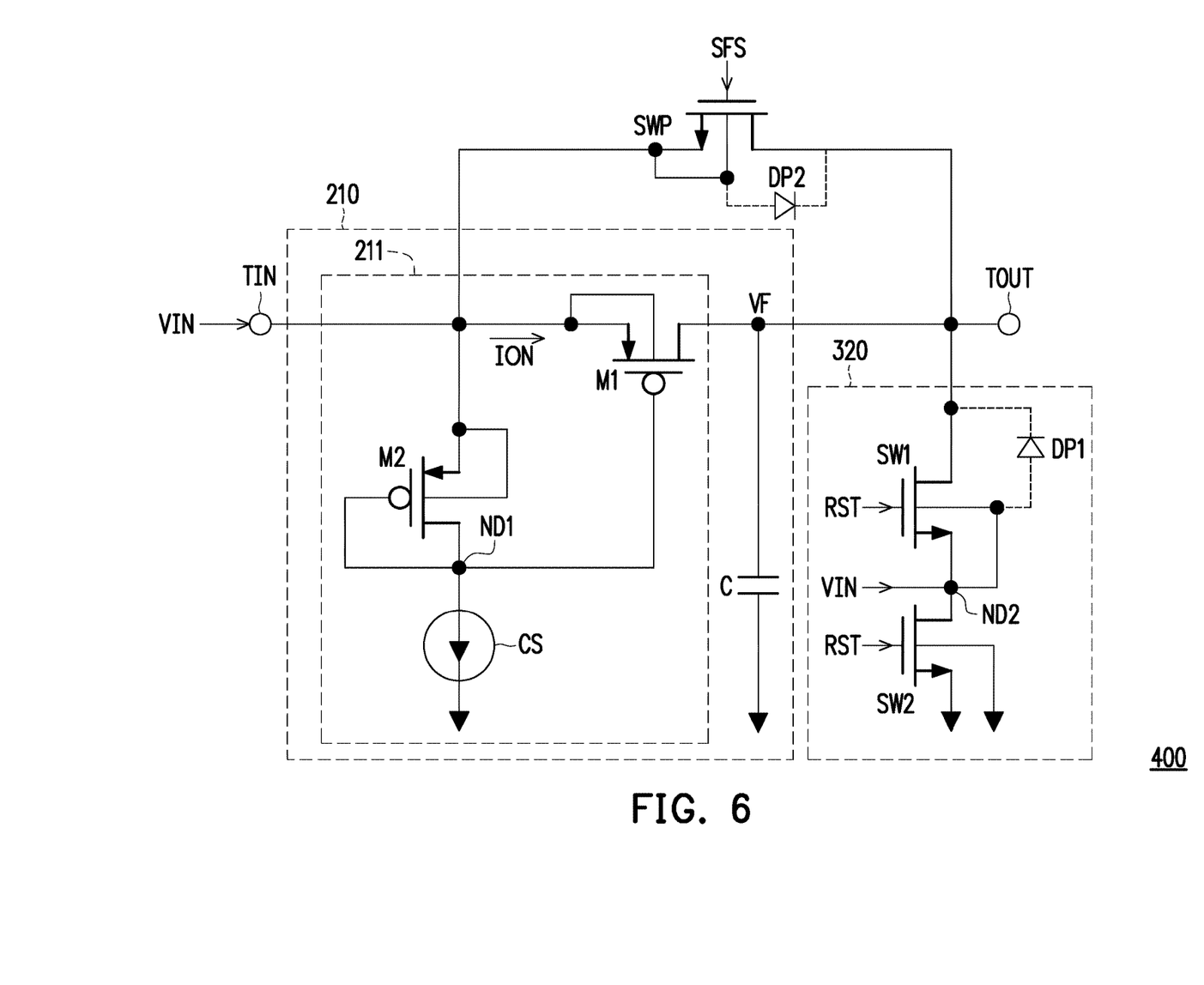
FIG. 6 is a schematic circuit diagram illustrating a low-pass filter circuit according to a fourth embodiment of the disclosure.

With reference to FIG. 6, FIG. 6 is a schematic circuit diagram illustrating a low-pass filter circuit according to a fourth embodiment of the disclosure. In this embodiment, a low-pass filter circuit 400 includes the low-pass filter 210, the discharging circuit 320, and a bypass switch SWP. The implementation of the low-pass filter 210 and the discharging circuit 320 is described in detail in the third embodiment, so description thereof is not repeated herein. In this embodiment, the bypass switch SWP is coupled to the low-pass filter 210 in parallel. In other words, the bypass switch SWP is coupled between the input terminal TIN and the output terminal TOUT of the low-pass filter circuit 400. At a starting time point of the first period, the bypass switch SWP may be turned on first to charge the output terminal TOUT with the input voltage signal VIN. When the voltage value of the output terminal TOUT is charged to a predetermined voltage value, the bypass switch SWP is turned off.

In this embodiment, the equivalent resistance generating circuit 211 has an excessively large equivalent resistance value. Therefore, the operating current ION may be excessively small. As such, the low-pass filter 210 needs to spend a long time during the first period to charge the output terminal TOUT to the expected voltage value, that is, a voltage value of the input voltage signal VIN. Therefore, at the starting time point of the first period, the bypass switch SWP is turned on based on a bypass control signal SFS. The turned-on bypass switch SWP forms a bypass path between the input terminal TIN and the output terminal TOUT. Therefore, the bypass switch SWP uses the input voltage signal VIN to rapidly charge the output terminal TOUT. Once the voltage value of the output terminal TOUT is charged to the predetermined voltage value, the bypass switch SWP is turned off. In this embodiment, the predetermined voltage value is substantially equal to the voltage value of the input voltage signal VIN.

In this embodiment, the bypass switch SWP may be implemented by BJT, any type of field-effect transistor, or a transmission gate. Taking this embodiment as an example, the bypass switch SWP is an N-type MOSFET. The bypass control signal SFS is a signal with a high voltage level. In this embodiment, a first terminal (i.e., a drain) of the bypass switch SWP is coupled to the output terminal TOUT. A second terminal of the bypass switch SWP is coupled to the input terminal TIN. In this embodiment, a parasitic diode DP2 is provided between a base and the first terminal of the bypass switch SWP. An anode of the parasitic diode DP2 corresponds to the body terminal the bypass switch SWP. A cathode of the parasitic diode DP1 corresponds to the first terminal of the bypass switch SWP. The second terminal of the bypass switch SWP is electrically connected to the body terminal the bypass switch SWP. Therefore, when the bypass switch SWP is turned off, a voltage difference between the anode and the cathode of the parasitic diode DP2 is substantially equal to 0 volts. Therefore, the parasitic diode DP2 does not have a reverse leakage current value. The above-mentioned scenario when the bypass switch SWP is turned off is, for example, the second period and the scenario when the voltage value of the output terminal TOUT is charged to the predetermined voltage value.

In some embodiments, the input voltage signal VIN, the reset signal RST, and the bypass control signal SFS may be provided by at least one external circuit (not shown).

Figure 7:
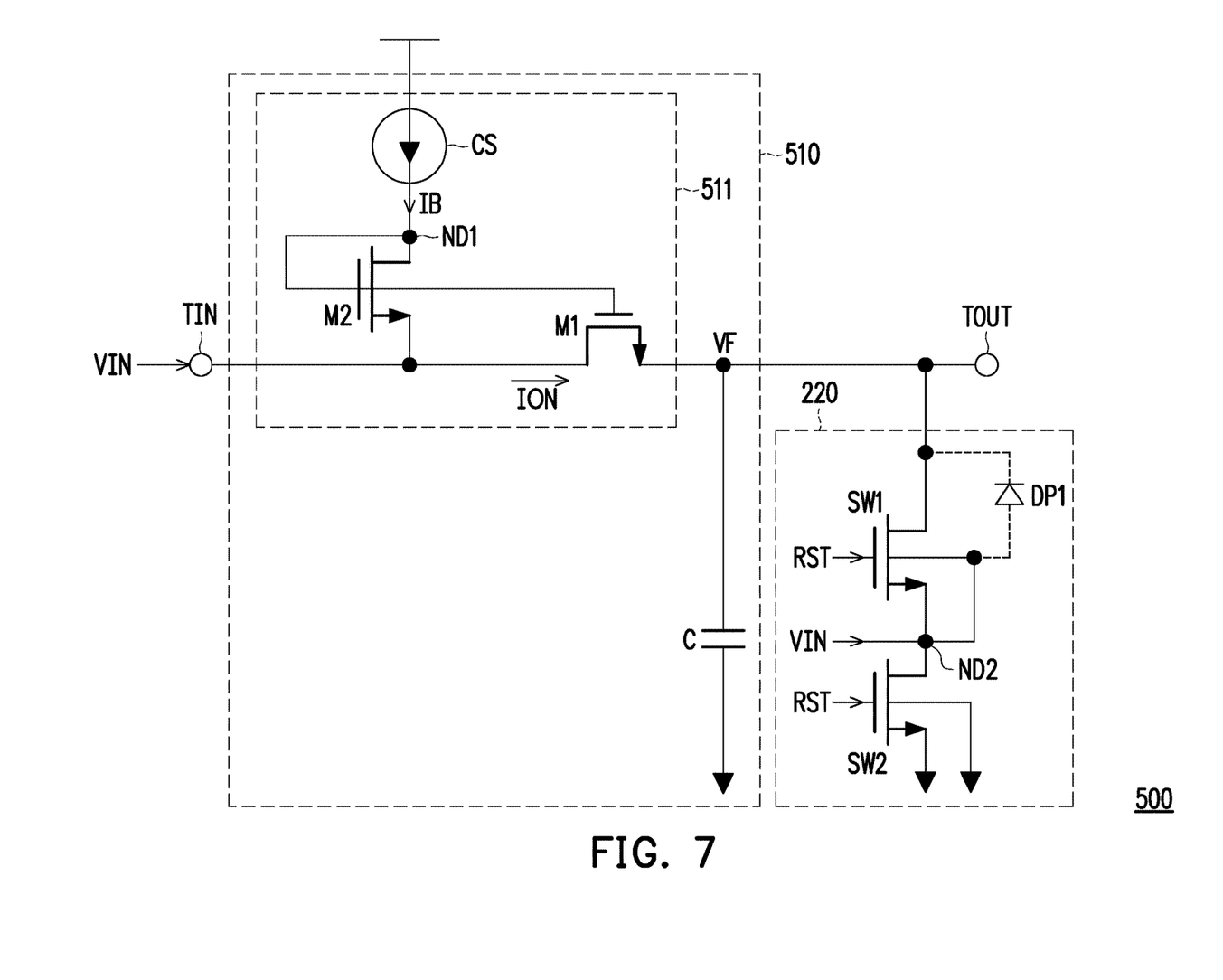
FIG. 7 is a schematic circuit diagram illustrating a low-pass filter circuit according to a fifth embodiment of the disclosure.

With reference to FIG. 7, FIG. 7 is a schematic circuit diagram illustrating a low-pass filter circuit according to a fifth embodiment of the disclosure. In this embodiment, a low-pass filter circuit 500 includes a low-pass filter 510 and the discharging circuit 220. The implementation of the discharging circuit 220 is described in detail in the second embodiment, so description thereof is not repeated herein. In this embodiment, the low-pass filter 510 includes an equivalent resistance generating circuit 511 and the capacitor C. The equivalent resistance generating circuit 511 is coupled between the input terminal TIN and the output terminal TOUT. The equivalent resistance generating circuit 211 is configured to generate the equivalent resistance value. The capacitor C is coupled between the output terminal TOUT and the reference low voltage. The capacitor C is configured to provide the capacitance value.

In this embodiment, the equivalent resistance generating circuit 511 includes the current source CS and the transistors M1 and M2. The current source CS is coupled to the reference node ND1. The current source CS provides the reference current IB to the reference node ND1. The first terminal of the transistor M1 is coupled to the input terminal TIN. The second terminal of the transistor M1 is coupled to the output terminal TOUT. The control terminal of the transistor M1 is coupled to the reference node ND1. The first terminal of the transistor M2 is coupled to the input terminal TIN. The second terminal of the transistor M2 and the control terminal of the transistor M2 are coupled to the reference node ND1.

In this embodiment, different from the equivalent resistance generating circuit 211 shown in FIG. 2, each of the transistors M1 and M2 of the equivalent resistance generating circuit 511 is an N-type MOSFET. The first terminal of the transistor M1 is the drain of the transistor M1. The second terminal of the transistor M1 is the source of the transistor M1. The control terminal of the transistor M1 is the gate of the transistor M1. The first terminal of the transistor M2 is the source of the transistor M2. The second terminal of the transistor M2 is the drain of the transistor M2. The control terminal of the transistor M2 is the gate of the transistor M2. In this embodiment, the transistors M1 and M2 may form a current mirror.

In this embodiment, the current source CS provides the reference current IB to the reference node ND1. A current value of the reference current IB is excessively low, about subnano amperes to nano amperes. The transistors M1 and M2 operate in the weak-inversion mode. The transistors M1 and M2 have substantially large on-resistance values. In terms of layout design, the aspect ratio of the channel of the transistor M1 is significantly less than the aspect ratio of the channel of the transistor M2. The current value of the operating current ION is significantly lower than the current value of the reference current IB. The equivalent resistance value is determined by the on-resistance value of the transistor M1. Therefore, the equivalent resistance generating circuit 511 may provide an excessively large equivalent resistance value based on the on-resistance value of the transistor M1. As such, the layout area of the capacitor C is allowed to be reduced.

In view of the foregoing, the low-pass filter circuit includes the low-pass filter and the discharging circuit. During the first period when the input voltage signal is received, the discharging circuit suppresses the leakage current flowing between the output terminal and the reference low voltage in response to the input voltage signal. In this way, under the excessively-low operating current condition, the low-pass filter circuit may not be affected by the leakage current and may still provide a stable filtered voltage signal. In some embodiments, the low-pass filter circuit further includes the bypass switch coupled to the low-pass filter in parallel. At the starting time point of the first period, the bypass switch is turned on first to charge the output terminal with the input voltage signal. At the starting time point of the first period, the bypass switch SWP is turned on. Therefore, the bypass switch uses the input voltage signal to rapidly charge the output terminal.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A low-pass filter circuit, comprising:
   a low-pass filter, coupled between an input terminal of the low-pass filter circuit and an output terminal of the low-pass filter circuit, configured to receive an input voltage signal through the input terminal during a first period, performing a low-pass filter operation on the input voltage signal to generate a filtered voltage signal, and providing the filtered voltage signal to the output terminal; and
   a discharging circuit, coupled between the output terminal and a reference low voltage, configured to receive the input voltage signal during the first period, and suppressing a leakage current flowing between the output terminal and the reference low voltage according to the input voltage signal and a reset signal, wherein the discharging circuit comprises:
- a first discharging switch, wherein a first terminal of the first discharging switch is coupled to the output terminal, a second terminal of the first discharging switch is coupled to a connection node, and a control terminal of the first discharging switch is configured to receive the reset signal; and
- a second discharging switch, wherein a first terminal of the second discharging switch is coupled to the second terminal of the first discharging switch, a second terminal of the second discharging switch is coupled to the reference low voltage, and a control terminal of the second discharging switch is configured to receive the reset signal, wherein during the first period:
- supply of the reset signal is stopped, such that both the first discharging switch and the second discharging switch are turned off, and
- the input voltage signal is provided to the connection node, such that a voltage value of the connection node is pulled up in response to the input voltage signal.

2. The low-pass filter circuit according to claim 1, wherein during a second period when the low-pass filter does not receive the input voltage signal, the discharging circuit pulls down a voltage value of the filtered voltage signal in response to the reset signal.

3. The low-pass filter circuit according to claim 2, wherein during the second period:
- the reset signal is provided,
- supply of the input voltage signal is stopped, and
- both the first discharging switch and the second discharging switch are turned on in response to the reset signal.

4. The low-pass filter circuit according to claim 2, wherein:
- the first discharging switch is a field-effect transistor, and
- the second terminal of the first discharging switch is electrically connected to a body terminal of the first discharging switch.

5. The low-pass filter circuit according to claim 1, wherein the low-pass filter comprises:
- an equivalent resistance generating circuit, coupled between the input terminal and the output terminal, configured to generate an equivalent resistance value; and
- a capacitor, coupled between the output terminal and the reference low voltage, configured to provide a capacitance value,
- wherein the capacitance value and the equivalent resistance value are used to determine a time constant of the low-pass filter.

6. The low-pass filter circuit according to claim 5, wherein the equivalent resistance generating circuit comprises:
- a current source, coupled to a reference node, configured to provide a reference current to the reference node;
- a first transistor, wherein a first terminal of the first transistor is coupled to the input terminal, a second terminal of the first transistor is coupled to the output terminal, and a control terminal of the first transistor is coupled to the reference node; and
- a second transistor, wherein a first terminal of the second transistor is coupled to the input terminal, and a second terminal of the second transistor and a control terminal of the second transistor are coupled to the reference node.

7. The low-pass filter circuit according to claim 6, wherein:
- an aspect ratio of a channel of the first transistor is less than an aspect ratio of a channel of the second transistor, and
- the equivalent resistance value is determined by an on-resistance value of the first transistor.

8. The low-pass filter circuit according to claim 1, further comprising:
- a bypass switch, coupled to the low-pass filter in parallel,
- wherein at a starting time point of the first period, the bypass switch is turned on to charge the output terminal with the input voltage signal,
- wherein when a voltage value of the output terminal is charged to a predetermined voltage value, the bypass switch is turned off.

* * * * *